United States Patent [19]

Miyamoto et al.

[11] Patent Number: 5,745,010
[45] Date of Patent: Apr. 28, 1998

[54] OPERATIONAL AMPLIFIER

[75] Inventors: Masayuki Miyamoto, Nabari; Kunihiko Iizuka, Sakai, both of Japan

[73] Assignee: Sharp Kabushiki Kaisha, Osaka, Japan

[21] Appl. No.: 641,288

[22] Filed: Apr. 30, 1996

[30] Foreign Application Priority Data

May 30, 1995 [JP] Japan ............................ 7-132256

[51] Int. Cl.$^6$ .................................................. H03F 1/34
[52] U.S. Cl. ........................... 330/294; 330/100; 330/107
[58] Field of Search ............................ 330/98, 99, 100, 330/107, 264, 294; 327/95, 111, 112, 345, 562; 326/83

[56] References Cited

U.S. PATENT DOCUMENTS 4,763,081  8/1988  Jason .................... 330/107 X
5,287,068  2/1994  Olmstead et al. .......... 330/294 X

FOREIGN PATENT DOCUMENTS 6-237148  8/1994  Japan .

OTHER PUBLICATIONS

R.G.H. Eschauzier et al., IEEE International Solid–State Circuits Conference, "A Programmable 1.5v CMOS class–AB Operational Amplifier with Hybrid Nested Miller Compensation for 120dB Gain and 6MHz UGF", Feb. 1994, vol. 37, pp. 246, 247, 346.

*Primary Examiner*—James B. Mullins
*Attorney, Agent, or Firm*—David G. Conlin; William J. Daley, Jr.

[57] ABSTRACT

An operational amplifier including reverse amplifiers interconnected in series in an odd number of stages not less than three, an element for feeding back an output from the reverse amplifier in the last stage to an input of the reverse amplifier in a first stage, and a feedback capacitance element provided across the input and output ends of at least one of the reverse amplifiers. The Miller effect makes the feedback current from the capacitance element appear as if it were increased by a factor of the amplification factor of a concerned inverter. Thus, the capacity of the capacitance element preventing the oscillation of the inverters can be reduced. As a result, the operational amplifier becomes highly responsive, and therefore, becomes operable for a high frequency signal.

9 Claims, 9 Drawing Sheets

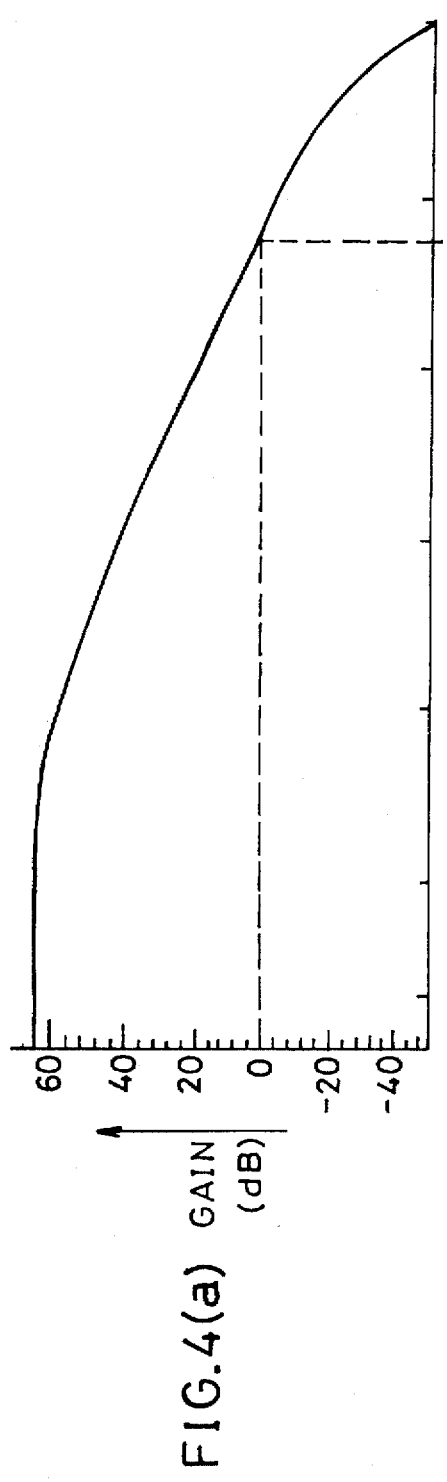
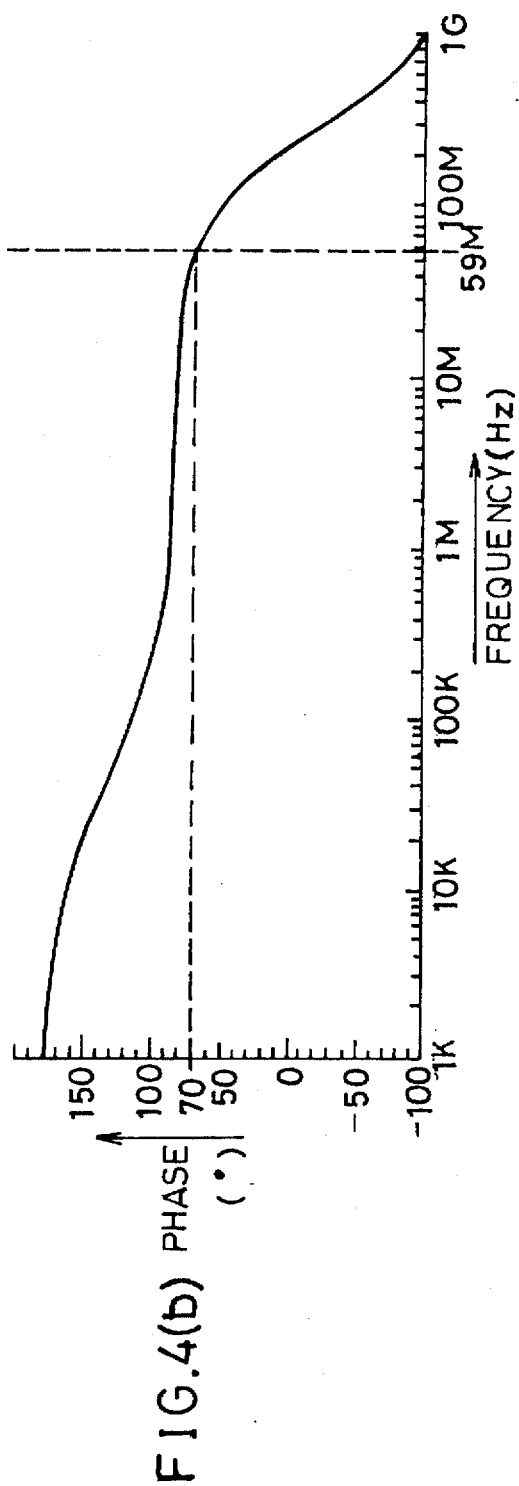
FIG. 4(a)
FIG. 4(b)

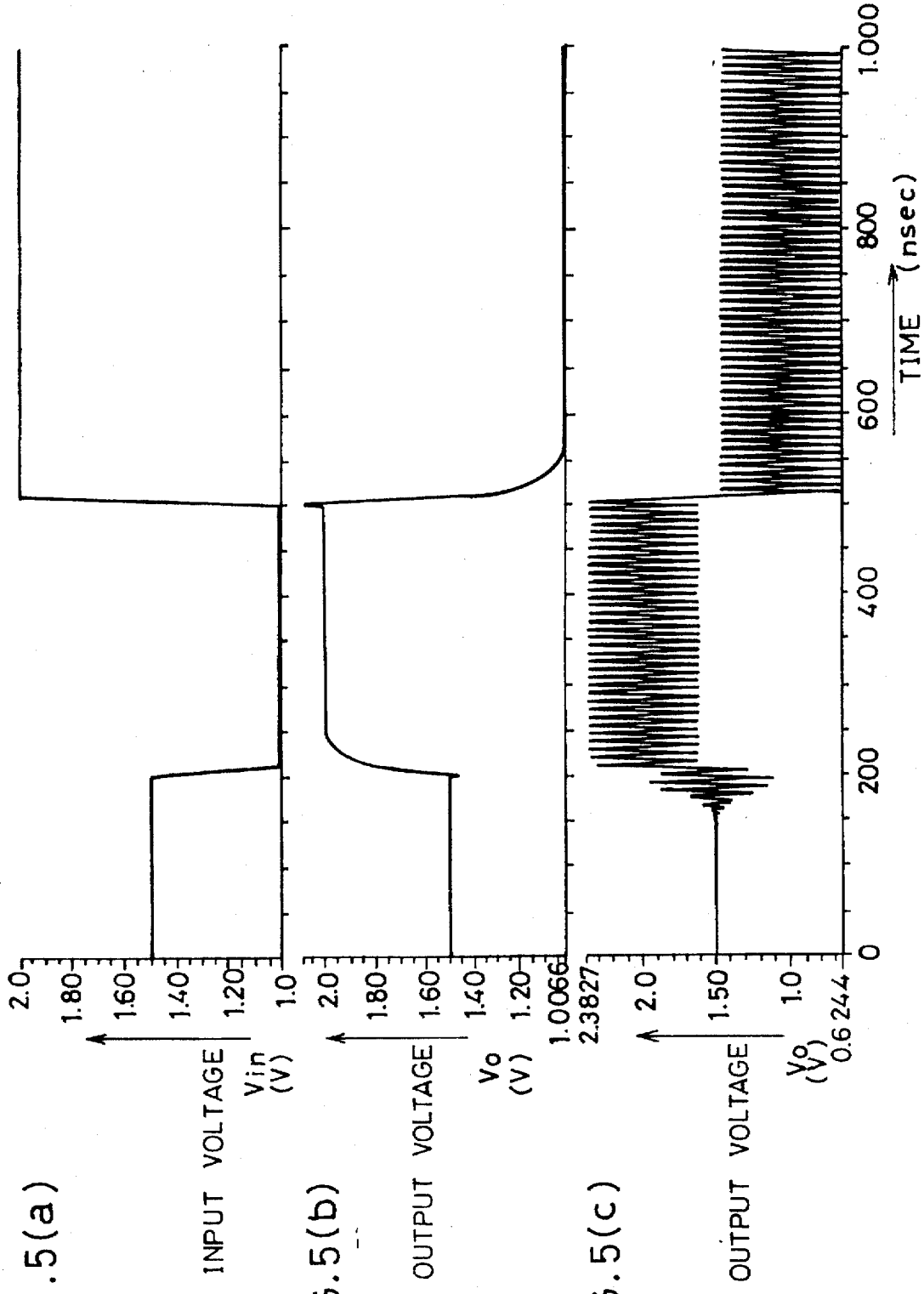

OPERATIONAL AMPLIFIER

FIELD OF THE INVENTION

The present invention relates to an operational amplifier for amplifying an analog input signal, and more particularly, to an operational amplifier comprising multi-staged inverters of a CMOS (Complementary Metal Oxide Semiconductor) structure.

BACKGROUND OF THE INVENTION

To compress data when an image or sound is transmitted or recorded, an analog data signal is generally converted into a digital signal and processed by a microprocessor for feature extraction or correlation detection. However, to upgrade resolving power, such as resolution, the microprocessor must process a tremendous amount of data, which causes an increase in cost and power consumption of the microprocessor.

Under these circumstances, attention is paid to a technique such that enables the feature extraction and correlation detection in the following manner: an analog signal is held by a plurality of sample holding circuits sequentially in time series and the hold voltages of the sample holding circuits are compared by an analog circuit. An example of such a technique is disclosed in Japanese Laid-open Patent Application No. 6-237148 (1994). The cited application discloses a structure to sequentially transfer a hold voltage through holding condensers from the input end side to the output end side.

In this case, however, each of the cascaded holding circuits demands an operational amplifier to compensate a signal level dropped due to a hold operation in the preceding stage. A typical operational amplifier of this type is disclosed in Japanese Laid-open Patent Application No. 7-94957 (1995).

FIG. 6 illustrates an electric circuit diagram of a conventional operational amplifier 1 mainly comprising three inverters b1, b2, and b3 which are interconnected in series. The input end of the inverter b3 in the third stage is connected to the output end of the inverter b2 in the second stage. The same is also connected to a high-level Vdd, such as a 3(V) power source line 2, and a low-level Vss, such as a 0(V) power source line 3, through a resistor r1 and a resistor r2, respectively. The resistors r1 and r2 have an equal resistance value and form a balancing resistor which serves as a gain adjustor.

As is shown in FIG. 7, each of the inverters b1 through b3 is of a CMOS structure including a pair of transistors: a transistor QP comprising a MOSFET (Metal Oxide Semiconductor Field Effect Transistor) of a P-type and a transistor QN comprising a MOSFET of an N-type.

The DC characteristics of an input voltage Vin with respect to an output voltage Vo in the above-structured operational amplifier 1 satisfy a relationship expressed as:

$$Vo - Vref = -A \cdot (Vin - Vref) \tag{1}$$

where Vref is an operating voltage to make Vo=Vin, and A is a product of the amplification factors of the inverters b1–b3 in the first through third stages, respectively.

FIG. 8 illustrates an example structure of the operational amplifier 1 when a feedback structure is additionally included. In the drawing, c0 represents a feedback capacitance element, and c1 represents an input-coupling capacitance element. Also, sw represents a switch flipped in the initial state to inhibit the floating of a potential of each capacitance element in the inverter b1 side. Thus, when the switch sw is open, the DC characteristics of the input voltage Vin with respect to the output voltage Vo are expressed as:

$$Vo - Vref = -(c1/c0) \cdot (Vin - Vref). \tag{2}$$

On the other hand, when the inverters b1 through b3 of a microscopic structure are fabricated in an integrated circuit, a delay time between the input and output becomes so short that the inverters b1 through b3 start to oscillate even on a relatively low frequency input signal. A conventional method to inhibit such unwanted oscillation is to place a loading capacitance element cl of a sufficiently large capacity across the output end of the inverter b3 in the last stage and the power source line 3 as shown in FIGS. 6 and 8.

The capacitance element cl of a large capacity does stabilize the input voltage Vin at a specific level, but in turn, it prolongs a time known as settling time to stabilize the output voltage Vo at a specific level, or increases an effective current amount to stabilize the output voltage Vo. This slows down an operation speed of the circuit and makes the operational amplifier inoperable for a high frequency signal.

The following description describes the above problem further. An equivalent circuit for a small signal in the operational amplifier 1 of FIG. 6 is illustrated in FIG. 9. In the drawing, cdi (hereinafter, i=1, 2, 3 unless specified otherwise) represents a parasitic capacity across the input and output (gate-drain capacity) of the inverter bi in the i'th stage and csi represents an input parasitic capacity, which are depicted in FIG. 10. Note that the input parasitic capacity cs1 of the inverter b1 in the first stage is so small that it is omitted in FIG. 9. Also, gmi represents a transconductance of the inverter bi and gdi represents an inverse number of an output resistance r of the inverter bi, each of which is found by the following equations, respectively:

$$gm = \partial Id/\partial Vg = 2 \cdot K \cdot (W/L) \cdot (Vgs - Vth) \tag{3}$$

$$gd = 1/r = \partial Id/\partial Vd \tag{4}$$

$$\lambda Id/(1 + \lambda Vds) \tag{5}$$

when a drain current Id of the MOSFET is defined as:

$$Id = K \cdot (W/L) \cdot (Vgs - Vth)^2 \cdot (1 + \lambda Vds) \tag{5}$$

where K is a constant number determined by the shape of the MOSFET, W is a gate width and L is a gate length of the MOSFET, Vgs is a gate-source voltage, Vth is an effective threshold voltage, Vds is a drain-source voltage, and λ is a conversion coefficient of a channel length.

According to the current conservation law, the followings are established at each points of a, b, and c in FIG. 9:

$$ia1 + ia2 + ia3 + ia4 = gm1 \cdot Vin + (gd1 + scs2)Va + \tag{6}$$
$$scd1(Va - Vin) + scd2(Va - Vb) = 0$$

$$ib1 + ib2 + ib3 + ib4 = gm2 \cdot Va + (gd2 + scs3)Vb + \tag{7}$$
$$scd2(Vb - Va) + scd3(Vb - Vo) = 0$$

$$ic1 + ic2 + ic3 = scd3(Vo - Vb) + gm3 \cdot Vb + \tag{8}$$
$$(gd3 + scl)Vo = 0.$$

By solving Equations 6 through 8, a transfer function $$h(s) \text{ is found as:} \tag{9}$$
$$h(s) = h0 \cdot \{(1 - s/sz1) \cdot (1 - s/sz2) \cdot (1 - s/sz3)\}/$$
$$\{(1 - s/sp1) \cdot (1 - s/sp2) \cdot (1 - s/sp3)\}$$

where h0 is a DC gain expressed as: (10)

-continued $$h0 = -(gm1 \cdot gm2 \cdot gm3)/(gd1 \cdot gd2 \cdot gd3).$$

When three solutions of a following equation: (11)

$$a0s^3 + a1s^2 + a2s + a3 = 0$$

are approximated as: (12)

$$a0s + a1 = 0 \quad (sp3)$$
$$a1s + a2 = 0 \quad (sp2)$$
$$a2s + a3 = 0 \quad (sp1)$$

then, a zero point sz and a pole sp are respectively expressed as:

$$sp1 = -(gd1 \cdot gd2 \cdot gd3)/ \qquad (13)$$
$$(cd3 \cdot gd1 \cdot gd2 + c1 \cdot gd1 \cdot gd2 + cd2 \cdot gd1 \cdot gd3 +$$
$$cd3 \cdot gd1 \cdot gd3 + cs3 \cdot gd1 \cdot gd3 + cd1 \cdot gd2 \cdot gd3 +$$
$$cd2 \cdot gd2 \cdot gd3 + cs2 \cdot gd2 \cdot gd3 + cd2 \cdot gd3 \cdot gm2 +$$
$$cd3 \cdot gd1 \cdot gm3)$$

$$sp2 = -(cd3 \cdot gd1 \cdot gd2 + c1 \cdot gd1 \cdot gd2 + cd2 \cdot gd1 \cdot gd3 + \qquad (14)$$
$$cd3 \cdot gd1 \cdot gd3 + cs3 \cdot gd1 \cdot gd3 + cd1 \cdot gd2 \cdot gd3 +$$
$$cd2 \cdot gd2 \cdot gd3 + cs2 \cdot gd2 \cdot gd3 + cd2 \cdot gd3 \cdot gm2 +$$
$$cd3 \cdot gd1 \cdot gm3)/$$
$$cd2 \cdot cd3 \cdot gd1 + cd2 \cdot c1 \cdot gd1 + cd3 \cdot c1 \cdot gd1 +$$
$$cd3 \cdot cs3 \cdot gd1 + c1 \cdot cs3 \cdot gd1 + cd1 \cdot cd3 \cdot gd2 +$$
$$cd2 \cdot cd3 \cdot gd2 + cd1 \cdot c1 \cdot gd2 + cd2 \cdot c1 \cdot gd2 +$$
$$cd3 \cdot cs2 \cdot gd2 + c1 \cdot cs2 \cdot gd2 + cd1 \cdot cd2 \cdot gd3 +$$
$$cd1 \cdot cd3 \cdot gd3 + cd2 \cdot cd3 \cdot gd3 + cd2 \cdot cs2 \cdot gd3 +$$
$$cd3 \cdot cs2 \cdot gd3 + cd1 \cdot cs3 \cdot gd3 + cd2 \cdot cs3 \cdot gd3 +$$
$$cs2 \cdot cs3 \cdot gd3 + cd2 \cdot cd3 \cdot gm2 + cd2 \cdot c1 \cdot gm2 +$$
$$cd1 \cdot cd3 \cdot gm3 + cd2 \cdot cd3 \cdot gm3 + cd3 \cdot cs2 \cdot gm3)$$

$$sp3 = -(cd2 \cdot cd3 \cdot gd1 + cd2 \cdot c1 \cdot gd1 + cd3 \cdot c1 \cdot gd1 + \qquad (15)$$
$$cd3 \cdot cs3 \cdot gd1 + c1 \cdot cs3 \cdot gd1 + cd1 \cdot cd3 \cdot gd2 +$$
$$cd2 \cdot cd3 \cdot gd2 + cd1 \cdot c1 \cdot gd2 + cd2 \cdot c1 \cdot gd2 +$$
$$cd3 \cdot cs2 \cdot gd2 + c1 \cdot cs2 \cdot gd2 + cd1 \cdot cd2 \cdot gd3 +$$
$$cd1 \cdot cd3 \cdot gd3 + cd2 \cdot cd3 \cdot gd3 + cd2 \cdot cs2 \cdot gd3 +$$
$$cd3 \cdot cs2 \cdot gd3 + cd1 \cdot cs3 \cdot gd3 + cd2 \cdot cs3 \cdot gd3 +$$
$$cs2 \cdot cs3 \cdot gd3 + cd2 \cdot cd3 \cdot gm2 + cd2 \cdot c1 \cdot gm2 +$$
$$cd1 \cdot cd3 \cdot gm3 + cd2 \cdot cd3 \cdot gm3 + cd3 \cdot cs2 \cdot gm3)/$$
$$(cd1 \cdot cd2 \cdot cd3 + cd1 \cdot cd2 \cdot c1 + cd1 \cdot cd3 \cdot c1 +$$
$$cd2 \cdot cd3 \cdot c1 + cd2 \cdot cd3 \cdot cs2 + cd2 \cdot c1 \cdot cs2 +$$
$$cd3 \cdot c1 \cdot cs2 + cd1 \cdot cd3 \cdot cs3 + cd2 \cdot cd3 \cdot cs3 +$$
$$cd1 \cdot c1 \cdot cs3 + cd2 \cdot c1 \cdot cs3 + cd3 \cdot cs2 \cdot cs3 +$$
$$c1 \cdot cs2 \cdot cs3)$$

$$sz1 = gm1/cd1 \qquad (16)$$
$$sz2 = gm2/cd2$$
$$sz3 = gm1/cd3.$$

Further, assuming that $f0<sp2$, a GB product $f0$ indicating a bandwidth in which a unity gain is obtainable is found by:

$$f0 = -(gm1 \cdot gm2 \cdot gm3)/ \qquad (17)$$
$$(cd3 \cdot gd1 \cdot gd2 + c1 \cdot gd1 \cdot gd2 + cd2 \cdot gd1 \cdot gd3 +$$
$$cd3 \cdot gd1 \cdot gd3 + cs3 \cdot gd1 \cdot gd3 + cd1 \cdot gd2 \cdot gd3 +$$
$$cd2 \cdot gd2 \cdot gd3 + cs2 \cdot gd2 \cdot gd3 + cd2 \cdot gd3 \cdot gm +$$
$$cd3 \cdot gd1 \cdot gm3).$$

Thus, since $c1>cdi$, $c1>csi$, $gmi$, $gd2>gd1$, $gd3$, in case that the first pole sp1 is determined by the capacitance element c1 and the gain is controlled using the resistors r1 and r2, we get:

$$sp1 = -gd3/c1 \qquad (18)$$
$$sp2 = -gd1/\{cd2 \cdot (gm2/gd2) + cd2 + cs2 + cd1\} \qquad (19)$$
$$f0 = (gm1 \cdot gm2 \cdot gm3)/(c1 \cdot gd1 \cdot gd2). \qquad (20)$$

Thus, let gd1=gd3=14μ, gd2=37μ, gm1=gm3=200μ, gm2=100μ, cdi=$10^{-15}$ (F), csi=$5\times10^{-15}$ (F), and cl=1 (pf), then, we get sp1≈−2 (MHz), sp2=−200 (MHz), f0≈1.2 (GHz), and h0≈500. However, the assumption, f0<sp2, is not satisfied and the actual GB product f0 is smaller than the above calculated value.

FIGS. 11(a) and 11(b) show Bode diagrams of the simulated characteristics of the operational amplifier 1 under the above conditions. Here, f0=203 (MHz) is found in FIG. 11(a), and a corresponding phase margin Φm is found as Φm=8.6(°) in FIG. 11(b). Therefore, the operational amplifier 1 readily starts to oscillate. To be more specific, when the capacitance element cl is downsized, it is understood from Equation 18 that the first pole sp1 moves farther from the origin and approaches to the second pole sp2, thereby reducing the phase margin Φm.

On the other hand, it is known that a following relationship must be established to secure a sufficient phase margin:

$$2 \cdot f0 < sp2. \qquad (21)$$

Under these conditions, it is understood from Equation 19 that the second pole sp2 varies considerably depending on the input parasitic capacity cs2 of the inverter b2. Thus, for example, let the gate wiring capacity be 10 (fF), then cs2=15(fF), and hence, we get sp2≈100 (MHz). Accordingly, to make f0≤100 (MHz), it is understood from Equation 20 and the above conditions that the relationship, cl>12 (pF), must be established.

Further, let the operating current of the inverter b3 be 40 (μA), then, we get cl=12 (pF), and hence, the through rate is found as:

$$\{40 \, (\mu A) \cdot 1 \, (\mu sec)\}/12 \, (pF) \approx 3(V/\mu sec). \qquad (22)$$

This means that if the output fluctuation width of the operational amplifier 1 is 1(V), for example, then the operational amplifier 1 can not operate for a signal having a frequency of 3 or more (MHz).

As has been explained, the capacitance element cl is conventionally upsized to secure a sufficient phase margin Φm, which, in turn, not only reduces the through rate, but also makes the operational amplifier inoperable for a high frequency signal.

SUMMARY OF THE INVENTION

It is therefore an object of the present invention to provide an operational amplifier operable in a high frequency range.

To fulfill the above object, an operational amplifier in accordance with the present invention, which includes reverse amplifiers interconnected in series in an odd number of stages not less than three and feeds back an output from the reverse amplifier in the last stage to an input to the reverse amplifier in the first stage, is characterized in that a feedback capacitance element is provided between the input and output ends of at least one of the reverse amplifiers.

To be more specific, in an operational amplifier that compensates a signal level between the stages of sample holding circuits sampling an analog input signal in time series to extract the feature and detect the correlation of the same, the reverse amplifiers are interconnected in series in an odd number of stages not less than three to feed back an output from the reverse amplifier in the last stage to an input to the reverse amplifier in the first stage and a feedback capacitance element is provided across the input and output ends of at least one of the reverse amplifiers.

Conventionally, the oscillation of the inverters is prevented by providing a load capacitance element of a large capacity, so that an output current becomes larger than a feedback current. In the present invention, however, the oscillation is prevented, with the best use of the Miller effect, by using a feedback capacitance element having a sufficiently small capacity compared with that of the load capacitance element, thereby making the operational amplifier highly responsive, and hence, operable for a high frequency signal.

In other words, the Miller effect makes the feedback current from the capacitance element appear as if it were increased by a factor of the amplification factor of a concerned inverter. Thus, the capacity of the capacitance element preventing the oscillation of the inverters can be reduced. As a result, the operational amplifier becomes highly responsive, and therefore, becomes operable for a high frequency signal.

For a fuller understanding of the nature and advantages of the invention, reference should be made to the ensuing detailed description taken in conjunction with the accompanying drawings.

BRIEF DESCRIPTION OF THE DRAWINGS

FIGS. 4(a) and 4(b) are graphs showing the frequency characteristics of the operational amplifier;

FIGS. 5(a) through 5(c) are graphs respectively showing an output waveform of a step input of the operational amplifier of the present invention and that of a conventional operational amplifier;

DESCRIPTION OF THE EMBODIMENT

Referring to the accompanying drawings, the following description will describe an example embodiment of the present invention.

Figure 1:
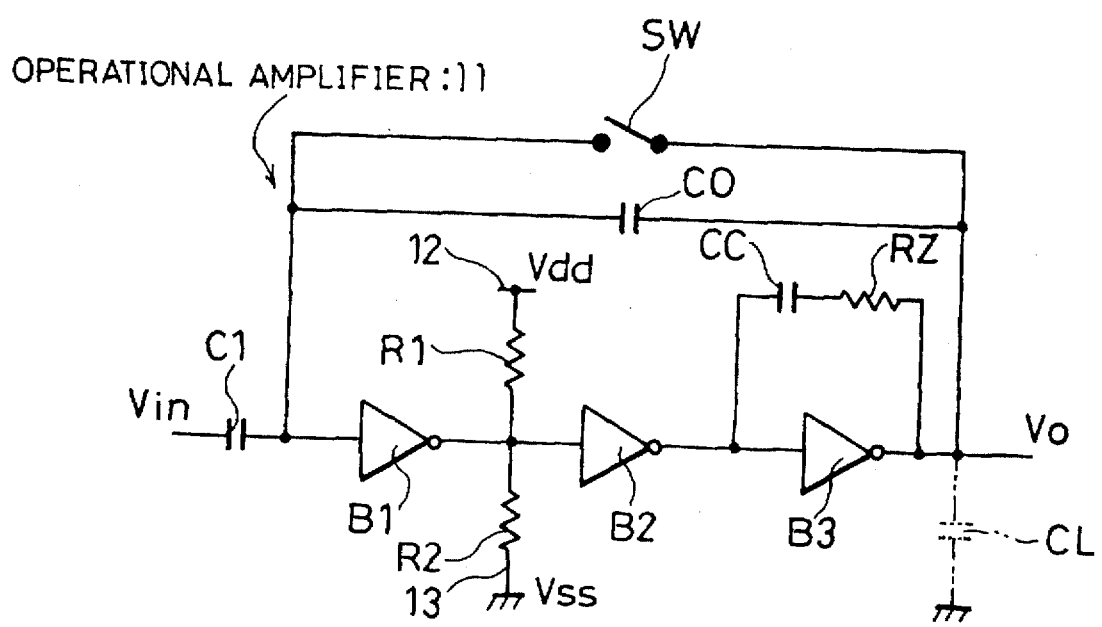
FIG. 1 shows an electric circuit diagram of an operational amplifier in accordance with an example embodiment of the present invention.

FIG. 1 is an electric circuit diagram of an example operational amplifier 11 in accordance with the present invention. The operational amplifier 11 mainly comprises three inverters B1, B2, and B3 which are interconnected in series. A feedback capacitance element CC and a resistor RZ are provided across the input and output ends of the inverter B3 in the third stage, and the input end of the inverter B2 in the second stage is connected to a high-level Vdd, such as a 3(V) power source line 12, and a low-level Vss, such as a 0(V) power source line 13, through a resistor R1 and a resistor R2, respectively. An input-coupling capacitance element C1 is provided in the input end side of the operational amplifier 11, and the input end and output end of the operational amplifier 11 are connected to each other through a feedback capacitance element C0 and a switch SW. The switch SW is flipped in the initial state to inhibit the floating of a potential of each capacitance element in the inverter B1 side.

Figure 2:
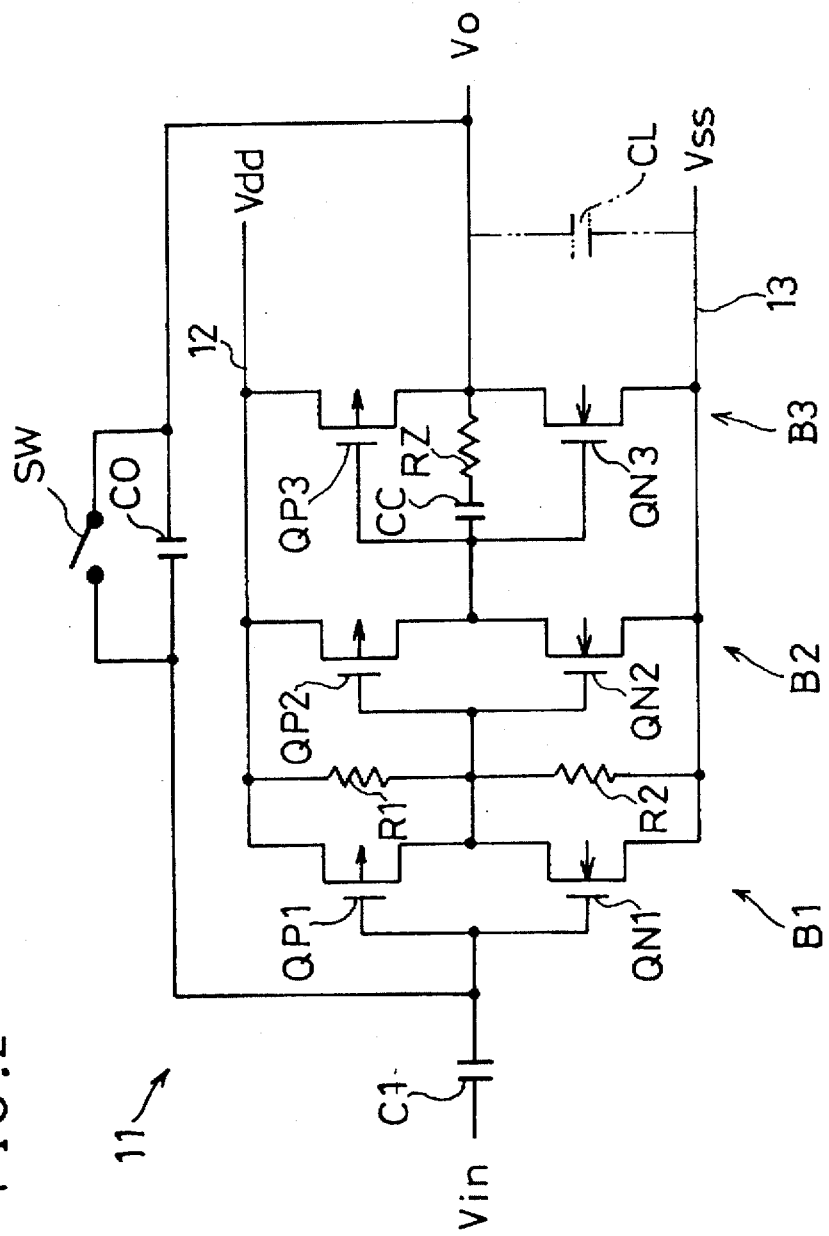
FIG. 2 is an electric circuit diagram depicting the structure of an example inverter of the operational amplifier.

FIG. 2 is an electric circuit diagram of the operational amplifier 11 depicting the structure of the inverter Bi (i=1, 2, 3). Each inverter Bi is of a CMOS structure including a pair of transistors: a transistor QPi comprising a MOSFET of a P-type and a transistor QNi comprising a MOSFET of an N-type.

In both the MOSFETQPi and MOSFETQNi, an input voltage Vin or an output voltage from the preceding inverter in immediately one stage ahead is inputted into the gate terminal while an output goes out from the drain terminal. In case of the MOSFETQPi, the source terminal is connected to the power source line 12 of the high-level Vdd, while the source terminal is connected to the power source line 13 of the low-level Vss in case of the MOSFETQNi.

Figure 3:
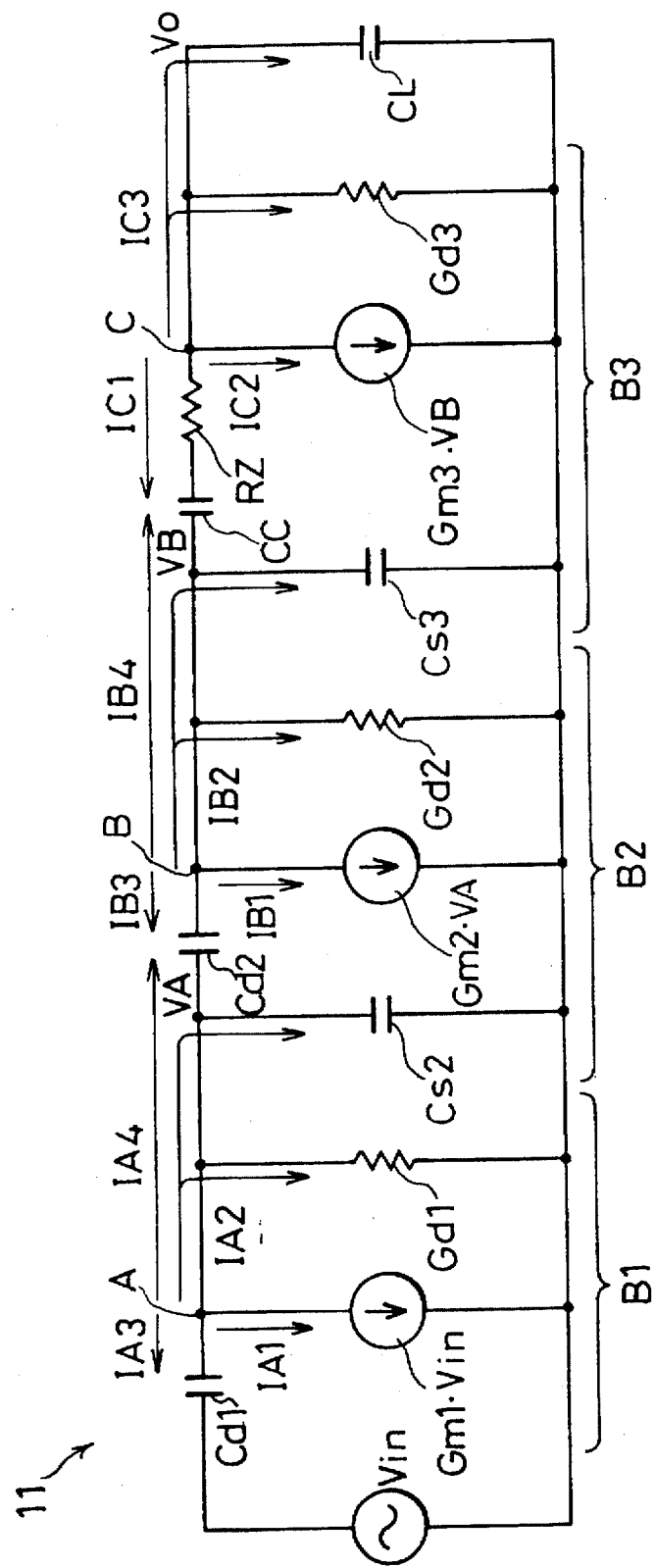
FIG. 3 is an example equivalent circuit diagram for a small signal of the operational amplifier.
Figure 10:
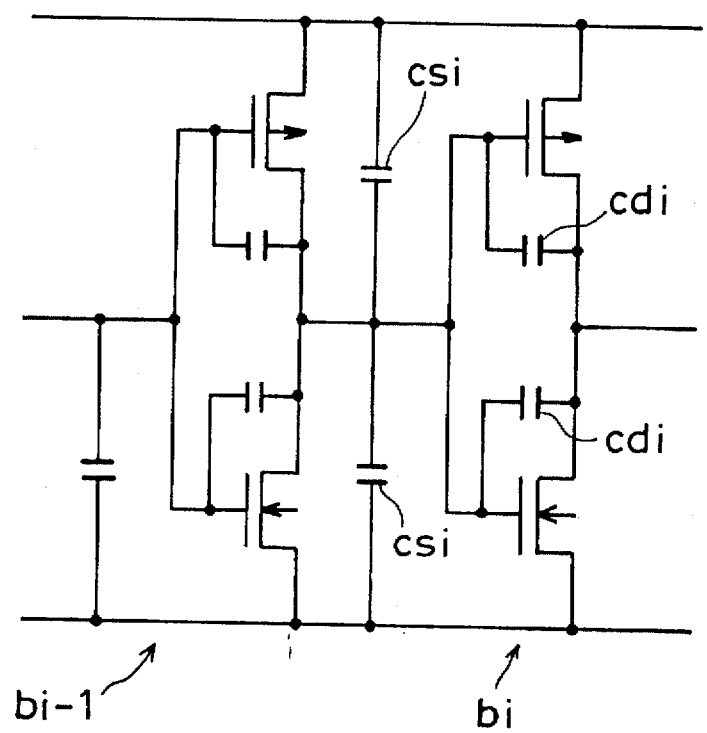
FIG. 10 is an electric circuit diagram of an inverter explaining a parasitic capacity in the equivalent circuit diagram of FIG. 9.
Figure 11A:
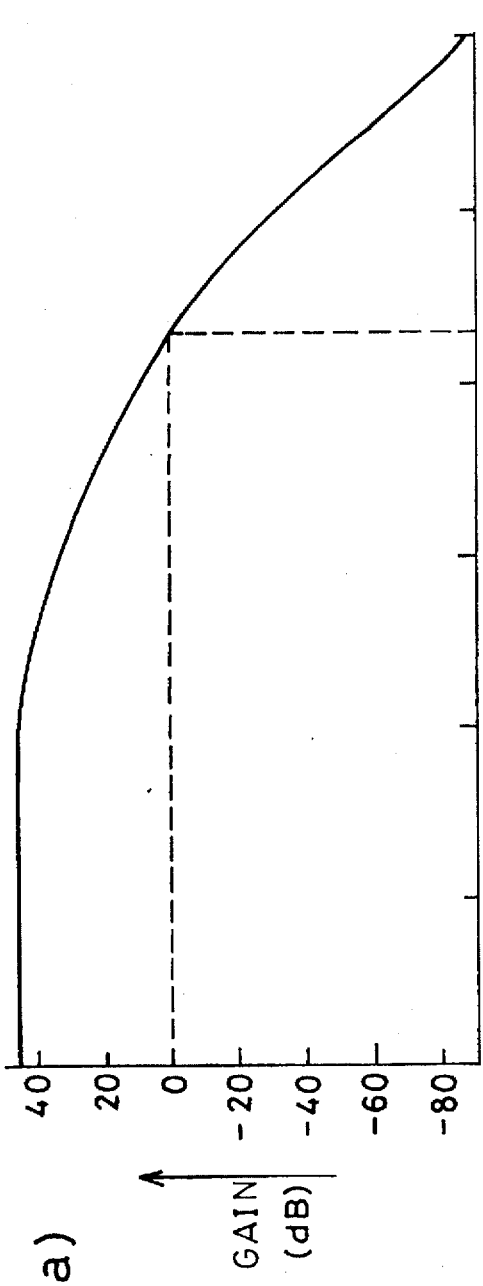
FIGS. 11(a) and 11(b) are graphs showing frequency characteristics of the operational amplifier of FIG. 6.
Figure 11B:
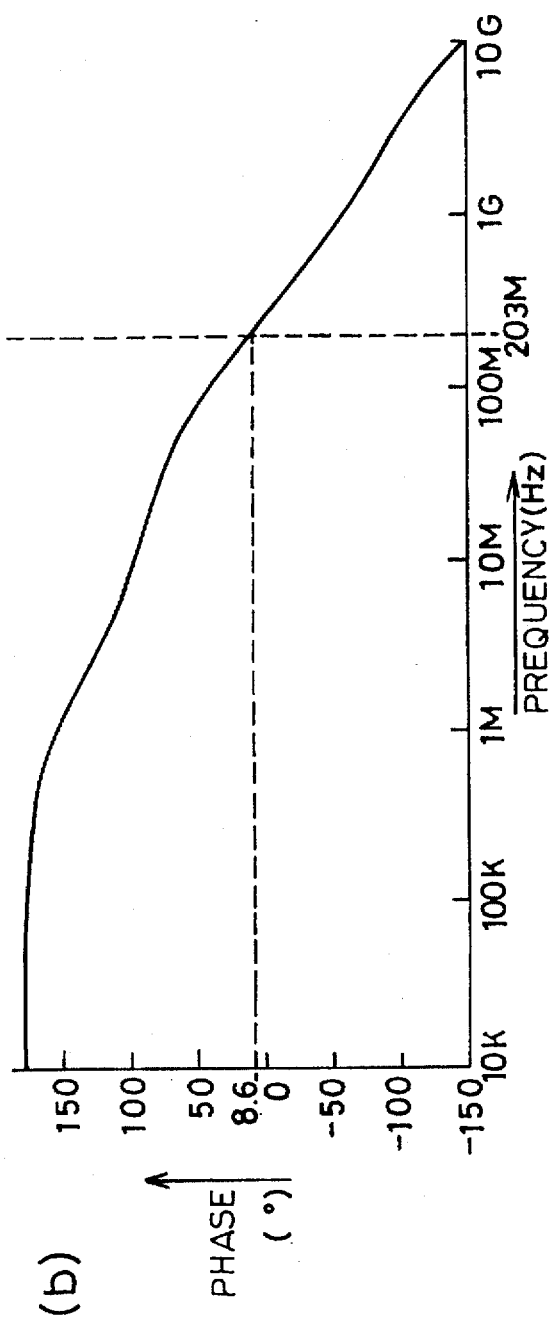

The equivalent circuit for a small signal in the above-structured operational amplifier 11 is shown in FIG. 3. In the drawing, Cdi represents a parasitic capacity across the input and output (gate-drain capacity) and Csi represents an input parasitic capacity of the inverter Bi in the i'th stage, which are depicted in FIG. 10. Note that, however, the input parasitic capacity Cs1 of the inverter B1 in the first stage is so small that it is omitted in FIG. 3. Also, Gmi is a transconductance of the inverter Bi and Gdi is an inverse number of an output resistance of the inverter Bi, each of which is found by Equations 3 and 4 above, respectively. Note that, since CC>cd3, CC alone is used hereinafter. Further, CL represents a load capacity generated in the output end while the operational amplifier 11 is in actual operation.

According to the current conservation law, the followings are established in each of the points A, B, and C in FIG. 3:

$$IA1 + IA2 + IA3 + IA4 = Gm1 \cdot Vin + (Gd1 + sCs2)VA + sCd1(VA - Vin) + sCd2(VA - VB) = 0 \quad (23)$$

$$IB1 + IB2 + IB3 + IB4 = Gm2 \cdot VA + (Gd2 + sCs3)VB + sCd2(VB - VA) + (1/sCC + RZ)^{-1} \cdot (VB - Vo) = 0 \quad (24)$$

$$IC1 + IC2 + IC3 = sCd3(Vo - VB) + Gm3 \cdot VB + (Gd3 + sCL)Vo = 0. \quad (25)$$

By solving Equations 23 through 25, a transfer function H(s) is found as:

$$H(s) = H0 \cdot \{(1 - s/SZ1) \cdot (1 - s/SZ2) \cdot (1 - s/SZ3)\}/\{(1 - s/SP1) \cdot (1 - s/SP2) \cdot (1 - s/SP3) \cdot (1 - s/SP4)\} \quad (26)$$

where H0 is a DC gain expressed as:

$$H0 = -(Gm1 \cdot Gm2 \cdot Gm3)/(Gd1 \cdot Gd2 \cdot Gd3). \quad (27)$$

Approximate expresses of a zero point SZ and a pole SP are respectively expressed as:

$$SP1 = -(Gd1 \cdot Gd2 \cdot Gd3)/ \quad (28)$$

-continued $$(CC \cdot Gd1 \cdot Gd2 + CL \cdot Gd1 \cdot Gd2 + Cd2 \cdot Gd1 \cdot Gd3 +$$
$$CC \cdot Gd1 \cdot Gd3 + Cs3 \cdot Gd1 \cdot Gd3 + Cd1 \cdot Gd2 \cdot Gd3 +$$
$$Cd2 \cdot Gd2 \cdot Gd3 + Cs2 \cdot Gd2 \cdot Gd3 + Cd2 \cdot Gd3 \cdot Gm2 +$$
$$CC \cdot Gd1 \cdot Gm3 + CC \cdot Gd1 \cdot Gd2 \cdot Gd3 \cdot RZ)$$

$$SP2 = -(CC \cdot Gd1 \cdot Gd2 + CL \cdot Gd1 \cdot Gd2 + Cd2 \cdot Gd1 \cdot Gd3 + \qquad (29)$$
$$CC \cdot Gd1 \cdot Gd3 + Cs3 \cdot Gd1 \cdot Gd3 + Cd1 \cdot Gd2 \cdot Gd3 +$$
$$Cd2 \cdot Gd2 \cdot Gd3 + Cs2 \cdot Gd2 \cdot Gd3 + Cd2 \cdot Gd3 \cdot Gm2 +$$
$$CC \cdot Gd1 \cdot Gm3 + CC \cdot Gd1 \cdot Gd2 \cdot Gd3 \cdot RZ)/$$
$$(Cd2 \cdot CC \cdot Gd1 + Cd2 \cdot CL \cdot Gd1 + CC \cdot CL \cdot Gd1 +$$
$$CC \cdot Cs3 \cdot Gd1 + CL \cdot Cs3 \cdot Gd1 + Cd1 \cdot CC \cdot Gd2 +$$
$$Cd2 \cdot CC \cdot Gd2 + Cd1 \cdot CL \cdot Gd2 + Cd2 \cdot CL \cdot Gd2 +$$
$$CC \cdot Cs2 \cdot Gd2 + CL \cdot Cs2 \cdot Gd2 + Cd1 \cdot Cd2 \cdot Gd3 +$$
$$Cd1 \cdot CC \cdot Gd3 + Cd2 \cdot CC \cdot Gd3 + Cd2 \cdot Cs2 \cdot Gd3 +$$
$$CC \cdot Cs2 \cdot Gd3 + Cd1 \cdot Cs3 \cdot Gd3 + Cd2 \cdot Cs3 \cdot Gd3 +$$
$$Cs2 \cdot Cs3 \cdot Gd3 + Cd2 \cdot CC \cdot Gm2 + Cd2 \cdot CL \cdot Gm2 +$$
$$Cd1 \cdot CC \cdot Gm3 + Cd2 \cdot CC \cdot Gm3 + CC \cdot Cs2 \cdot Gm3 +$$
$$CC \cdot CL \cdot Gd1 \cdot Gd2 \cdot RZ + Cd2 \cdot CC \cdot Gd1 \cdot Gd3 \cdot RZ +$$
$$CC \cdot Cs3 \cdot Gd1 \cdot Gd3 \cdot RZ + Cd1 \cdot CC \cdot Gd2 \cdot Gd3 \cdot RZ +$$
$$Cd2 \cdot CC \cdot Gd2 \cdot Gd3 \cdot RZ + CC \cdot Cs2 \cdot Gd2 \cdot Gd3 \cdot RZ +$$
$$Cd2 \cdot CC \cdot Gd3 \cdot Gm2 \cdot RZ)$$

$$SP3 = -(Cd2 \cdot CC \cdot Gd1 + Cd2 \cdot CL \cdot Gd1 + CC \cdot CL \cdot Gd1 + \qquad (30)$$
$$CC \cdot Cs3 \cdot Gd1 + CL \cdot Cs3 \cdot Gd1 + Cd1 \cdot CC \cdot Gd2 +$$
$$Cd2 \cdot CC \cdot Gd2 + Cd1 \cdot CL \cdot Gd2 + Cd2 \cdot CL \cdot Gd2 +$$
$$CC \cdot Cs2 \cdot Gd2 + CL \cdot Cs2 \cdot Gd2 + Cd1 \cdot Cd2 \cdot Gd3 +$$
$$Cd1 \cdot CC \cdot Gd3 + Cd2 \cdot CC \cdot Gd3 + Cd2 \cdot Cs2 \cdot Gd3 +$$
$$CC \cdot Cs2 \cdot Gd3 + Cd1 \cdot Cs3 \cdot Gd3 + Cd2 \cdot Cs3 \cdot Gd3 +$$
$$Cs2 \cdot Cs3 \cdot Gd3 + Cd2 \cdot CC \cdot Gm2 + Cd2 \cdot CL \cdot Gm2 +$$
$$Cd1 \cdot CC \cdot Gm3 + Cd2 \cdot CC \cdot Gm3 + CC \cdot Cs2 \cdot Gm3 +$$
$$CC \cdot CL \cdot Gd1 + Gd2 \cdot RZ + Cd2 \cdot CC \cdot Gd1 \cdot Gd3 \cdot RZ +$$
$$CC \cdot Cs3 \cdot Gd1 \cdot Gd3 \cdot RZ + Cd1 \cdot CC \cdot Gd2 \cdot Gd3 \cdot RZ +$$
$$Cd2 \cdot CC \cdot Gd2 \cdot Gd3 \cdot RZ + CC \cdot Cs2 \cdot Gd2 \cdot Gd3 \cdot RZ +$$
$$Cd2 \cdot CC \cdot Gd3 \cdot Gm2 \cdot RZ)/$$
$$(Cd1 \cdot Cd2 \cdot CC + Cd1 \cdot Cd2 \cdot CL + Cd1 \cdot CC \cdot CL +$$
$$Cd2 \cdot CC \cdot CL + Cd2 \cdot CC \cdot Cs2 + Cd2 \cdot CL \cdot Cs2 +$$
$$CC \cdot CL \cdot Cs2 + Cd1 \cdot CC \cdot Cs3 + Cd2 \cdot CC \cdot Cs3 +$$
$$Cd1 \cdot CL \cdot Cs3 + Cd2 \cdot CL \cdot Cs3 + CC \cdot Cs2 \cdot Cs3 +$$
$$CL \cdot Cs2 \cdot Cs3 + Cd2 \cdot CC \cdot CL \cdot Gd1 \cdot RZ +$$
$$CC \cdot CL \cdot Cs3 \cdot Gd1 \cdot RZ + Cd1 \cdot CC \cdot CL \cdot Gd2 \cdot RZ +$$
$$Cd2 \cdot CC \cdot CL \cdot Gd2 \cdot RZ + CC \cdot CL \cdot Cs2 \cdot Gd2 \cdot RZ +$$
$$Cd1 \cdot Cd2 \cdot CC \cdot Gd3 \cdot RZ + Cd2 \cdot CC \cdot Cs2 \cdot Gd3 \cdot RZ +$$
$$Cd1 \cdot CC \cdot Cs3 \cdot Gd3 \cdot RZ + Cd2 \cdot CC \cdot Cs3 \cdot Gd3 \cdot RZ +$$
$$CC \cdot Cs2 \cdot Cs3 \cdot Gd3 \cdot RZ + Cd2 \cdot CC \cdot CL \cdot Gm2 \cdot RZ)$$

$$SP4 = -(Cd1 \cdot Cd2 \cdot CC + Cd1 \cdot Cd2 \cdot CL + Cd1 \cdot CC \cdot CL + \qquad (31)$$
$$Cd2 \cdot CC \cdot CL + Cd2 \cdot CC \cdot Cs2 + Cd2 \cdot CL \cdot Cs2 +$$
$$CC \cdot CL \cdot Cs2 + Cd1 \cdot CC \cdot Cs3 + Cd2 \cdot CC \cdot Cs3 +$$
$$Cd1 \cdot CL \cdot Cs3 + Cd2 \cdot CL \cdot Cs3 + CC \cdot Cs2 \cdot Cs3 +$$
$$CL \cdot Cs2 \cdot Cs3 + Cd2 \cdot CC \cdot CL \cdot Gd1 \cdot RZ +$$
$$CC \cdot CL \cdot Cs3 \cdot Gd1 \cdot RZ + Cd1 \cdot CC \cdot CL \cdot Gd2 \cdot RZ +$$
$$Cd2 \cdot CC \cdot CL \cdot Gd2 \cdot RZ + CC \cdot CL \cdot Cs2 \cdot Gd2 \cdot RZ +$$
$$Cd1 \cdot Cd2 \cdot CC \cdot Gd3 \cdot RZ + Cd2 \cdot CC \cdot Cs2 \cdot Gd3 \cdot RZ +$$
$$Cd1 \cdot CC \cdot Cs3 \cdot Gd3 \cdot RZ + Cd2 \cdot CC \cdot Cs3 \cdot Gd3 \cdot RZ +$$
$$CC \cdot Cs2 \cdot Cs3 \cdot Gd3 \cdot RZ + Cd2 \cdot CC \cdot CL \cdot Gm2 \cdot RZ)/$$
$$(Cd1 \cdot Cd2 \cdot CC \cdot CL \cdot RZ + Cd2 \cdot CC \cdot CL \cdot Cs2 \cdot RZ +$$
$$Cd1 \cdot CC \cdot CL \cdot Cs3 \cdot RZ + Cd2 \cdot CC \cdot CL \cdot Cs3 \cdot RZ +$$
$$CC \cdot CL \cdot Cs2 \cdot Cs3 \cdot RZ)$$

$$SZ1 = Gm1/Cd1 \qquad (32)$$
$$SZ2 = Gm2/Cd2$$
$$SZ3 + Gm3/(CC - CC \cdot Gm3 \cdot RZ).$$

Further, the GB product F0 indicating the unity gain bandwidth is found by:

$$F0 = -(Gm1 \cdot Gm2 \cdot Gm3)/ \qquad (33)$$
$$(CC \cdot Gd1 \cdot Gd2 + CL \cdot Gd1 \cdot Gd2 + Cd2 \cdot Gd1 \cdot Gd3 +$$
$$CC \cdot Gd1 \cdot Gd3 + Cs3 \cdot Gd1 \cdot Gd3 + Cd1 \cdot Gd2 \cdot Gd3 +$$
$$Cd2 \cdot Gd2 \cdot Gd3 + Cs2 \cdot Gd2 \cdot Gd3 + Cd2 \cdot Gd3 \cdot Gm2 +$$
$$CC \cdot Gd1 \cdot Gd3 + CC \cdot Gd1 \cdot Gd2 \cdot Gd3 \cdot RZ).$$

Therefore, $$SP1 \approx -(Gd2 \cdot Gd3)/(CC \cdot Gm3) \qquad (34)$$
$$SP2 \approx -Gm3/CL \qquad (35)$$
$$SP3 \approx -Gd1/(Cd1 + Cd2 + Cs2) \qquad (36)$$
$$SZ3 = Gm3/\{CC(1 - Gm3 \cdot RZ)\}. \qquad (37)$$

It is understood from Equation 34 that the Miller effect makes the capacity of the capacitance element CC appear, if seen from the output end of the inverter B2 in the second stage, as if it were increased by a factor of the amplification factor of the inverter B3 in the third stage. Accordingly, the transfer function H(s) includes the first pole SP1 at the position indicated by Equation 34.

Figure 6:
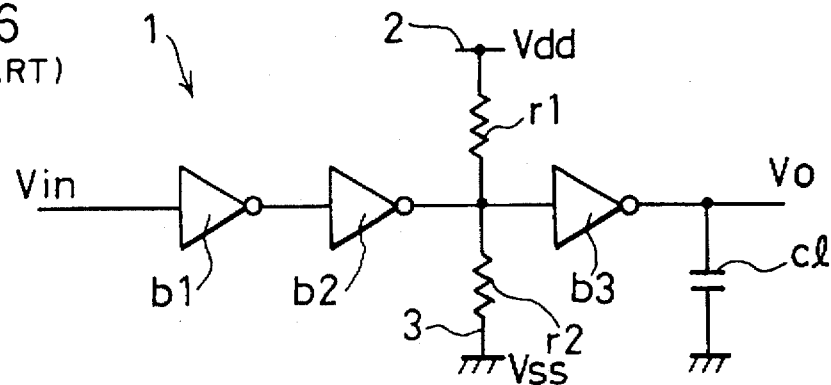
FIG. 6 is an electric circuit diagram of a typical conventional operational amplifier.
Figure 7:
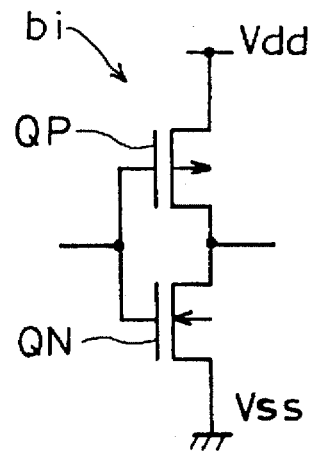
FIG. 7 is an electric circuit diagram depicting the structure of an inverter of the above operational amplifier.

Thus, when the inverter B2 in the second stage and the inverter B3 in the third stage are of the same structure, we get Gd2=Gd3. Then, to match the first pole sp1 of the operational amplifier 1 of FIG. 6 with the first pole SP1 in position, the capacity of the capacitance element CC is determined in such a way to satisfy the following:

$$(Gm3/Gd3) \cdot CC = c1. \qquad (38)$$

Since (Gm3/Gd3)=tens in case of a general CMOS inverter, the load capacity CL to prevent oscillation is reduced to a few tenths of one. As a result, the operational amplifier can increase the operation speed and becomes operable for a high frequency signal.

In addition, as is indicated in Equation 35, the transfer function H(s) includes the second pole SP2, which is determined by the load capacity CL generated while the operational amplifier 11 is in actual operation. Thus, when the load capacity CL becomes excessively large, the phase margin Φm is reduced and the inverter Bi readily starts to oscillate. To eliminate this problem, the resistor RZ is provided in series with the capacitance element CC in the feedback loop in the present invention. Accordingly, the second pole SP2 can be cancelled at the zero point SZ3 by giving a value such that makes SP2=SZ3 to the resistance value of the resistor RZ, in other words, by introducing the following equation from Equations 35 and 37:

$$-1/CL = 1/\{CC(1 - Gm3 \cdot RZ)\}. \qquad (39)$$

As a result, the third pole SP3 matches with the second pole, and, on the assumption that F0<SP3, the GB product F0 indicating the unity gain bandwidth is found by:

$$F0 = (Gm1 \cdot Gm2)/(CC \cdot Gd1). \qquad (40)$$

Thus, the GB product F0 can be controlled by increasing an inverse number Gd1 of the output resistance of the inverter B1, in other words, by reducing the gain.

For example, let W/L of the MOSFETQPi be 7.6 (μm)/1.5 (μm), W/L of the MOSFETQNi be 2.2 (μm)/1.5 (μm), Gd1=44μ, Gd2=Gd3=4μ, Gmi=120μ, CC=0.5 (pF), CL=1 (pF), RZ=25 (KΩ), then we get SP2=SZ3≈−20 (MHz), F0≈100 (MHz), and SP3≈−500 (MHz).

Bode diagrams of the simulated frequency characteristics of the operational amplifier 11 under the above conditions are shown in FIGS. 4(a) and 4(b). In contrast to the computation result using the approximate expressions, F0=59 (MHz) is found in FIG. 4(a) due to the influence of a high order pole or the like, and a corresponding phase margin Φm is found as Φm=70(°) in FIG. 4(b).

Figure 8:
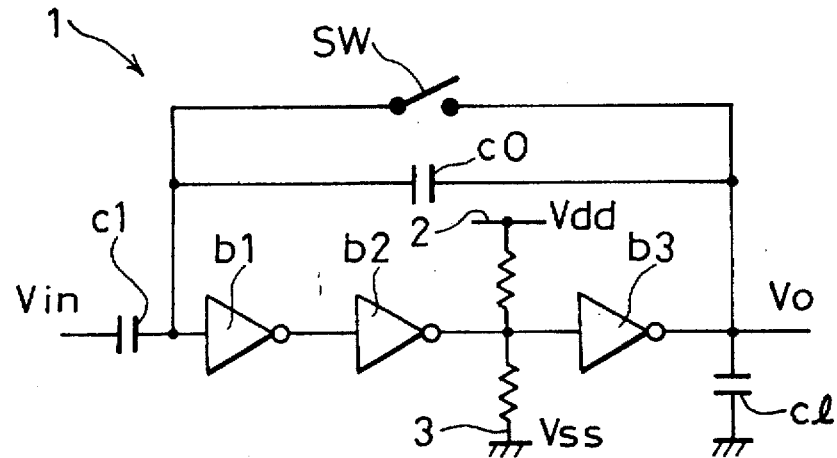
FIG. 8 is an electric circuit diagram depicting an example structure of the operational amplifier of FIG. 6 when a feedback structure is additionally included.
Figure 9:
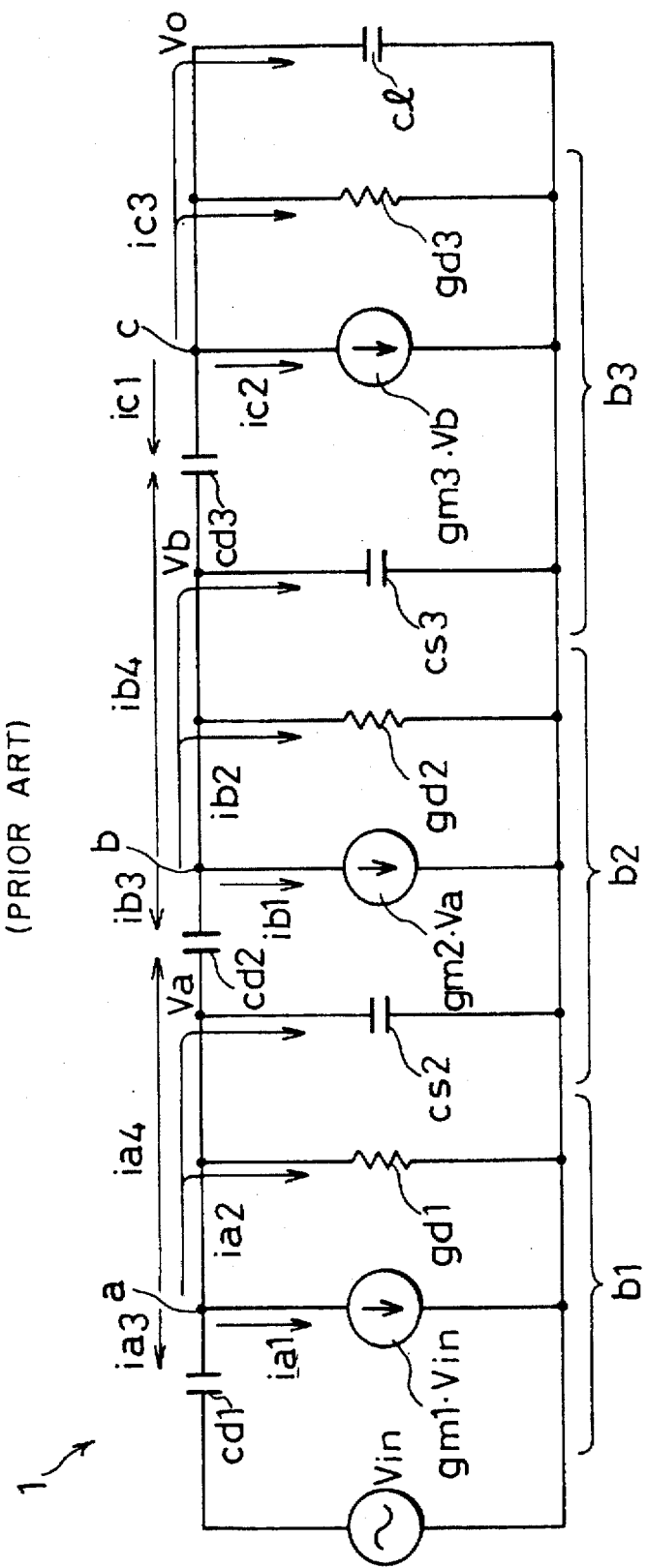
FIG. 9 is an equivalent circuit diagram for a small signal of the operational amplifier of FIG. 6.

Further, FIGS. 5(a) through 5(c) are graphs showing the result of a simulation carried out by the inventors of the present invention. FIG. 5(b) shows an output waveform from the operational amplifier 11 of the present invention structured as FIG. 1 in response to an input shown in FIG. 5(a), while FIG. 5(c) shows an output waveform from the conventional operational amplifier 1 structured as FIG. 8 in response to the same input. Herein, the parameters are set to the same values given above except that let the gain of each operational amplifier be 1, and c0=c1=C0=C1=1 (pF), CC=0.5 (pF), and RZ=15 (KΩ). Note that these parameters reflect the consideration to the parasitic capacity that varies depending on the wiring pattern.

As previously mentioned, the adverse effect of the second pole SP2 to the frequency characteristics can be eliminated as shown in FIG. 4 by offsetting the second pole SP2 by the zero point SZ3. Thus, the GB product F0 is increased and so is the phase margin Φm, thereby making it possible to realize the effect as shown in FIG. 5.

Alternatively, the number of the stages of the inverters Bi is not limited to three, and it may be an odd number not less than 5. In this case, the capacitance element CC and resistor RZ are provided to at least one of the reverse amplifiers. Further, the resistors R1 and R2 may be provided arbitrary to a reverse amplifier in the second stage or beyond whose preceding reverse amplifier in immediately one stage ahead receives no feedback from the capacitance element CC and resistor RZ. Moreover, the application of the present invention is not limited to the feedback structure using the capacitance element C0, and the present invention may be applied to another feedback structure using a resistor or inductance element.

As has been explained, a first operational amplifier of the present invention, which includes reverse amplifiers interconnected in series in an odd number of stages not less than three and feeds back an output from the reverse amplifier in the last stage to an input of the reverse amplifier in the first stage, is characterized in that a feedback capacitance element is provided across the input and output ends of at least one of the reverse amplifiers.

To be more specific, in an operational amplifier that compensates a signal level between the stages of sample holding circuits sampling an analog input signal in time series to extract the feature and detect the correlation of the same, the reverse amplifiers are interconnected in series in an odd number of stages not less than three to feed back an output from the reverse amplifier in the last stage to an input of the reverse amplifier in the first stage and a feedback capacitance element is provided across the input and output ends of at least one of the reverse amplifiers.

Conventionally, the oscillation of the inverters is prevented by providing a load capacitance element of a large capacity, so that an output current becomes larger than a feedback current. In the present invention, however, the oscillation is prevented, with the best use of the Miller effect, by using a feedback capacitance element with a sufficiently small capacity compared with the capacity of the load capacity, thereby making the operational amplifier highly responsive and hence operable for a high frequency signal.

A second operational amplifier of the present invention is characterized in that it further includes a phase compensating resistor placed in series with the capacitance element.

More precisely, the phase compensating resistor is placed in series with the capacitance element in the feedback loop.

Accordingly, the second pole generated at the output end by the load capacity can be offset by the zero point generated by the phase compensating resistor while the operational amplifier is in operation. As a result, the adverse effect of the second pole on the frequency characteristics is eliminated and the phase margin can be increased.

A third operational amplifier of the present invention is characterized in that (1) each reverse amplifier is connected to a first operating power source line and a second operating power source line having their respective levels, and (2) the operational amplifier further includes a balancing resistor serving as a gain adjustor, so that the input end of at least one of the reverse amplifiers in the second stage or beyond, whose preceding reverse amplifier in immediately one stage ahead is not provided with the capacitance element, is connected to the first and second operating power source lines respectively through a first resistor and a second resistor having an equal resistance value.

To be more specific, each reverse amplifier is connected to the first and second operating power source lines having their respective levels, for example, one has a level of 3(V) and the other 0(V). Under these conditions, a balancing resistor having the equal resistance values, which serves as a gain adjustor, is provided to connect the first and second operating power source lines to the input end of at least one of the reverse amplifiers in the second stage or beyond whose preceding reverse amplifier in immediately one stage ahead receives no feedback from the capacitance element.

A fourth operational amplifier of the present invention is characterized in that it includes reverse amplifiers in three stages, and the balancing resistor is provided to the input end of the reverse amplifier in the second stage while the feedback is carried out between the input and output ends of the reverse amplifier in the third stage.

In short, the reverse amplifiers are provided in three stages, and the feedback is carried out with the reverse amplifier in the third stage while the balancing resistor is provided to the input end of the reverse amplifier in the second stage.

Accordingly, the unity gain bandwidth can be adjusted depending on the resistance value of the balancing resistor.

A fifth operational amplifier of the present invention is characterized in that each reverse amplifier is composed of a pair of field effect transistors made of a complementary metal oxide semiconductor.

To be brief, each reverse amplifier is made of a CMOS-FET.

Accordingly, the structure for preventing oscillation can be preferably applied to an inverter of a microscopic CMOS structure having a short delay time between the input and output. As a result, the present invention can be preferably applied to an inverter of a microscopic CMOS structure having a short delay time between the input and output, and hence, readily starts to oscillate.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. An operational amplifier including:

reverse amplifiers interconnected in series in an odd number of stages not less than three;

means for feeding back an output from a reverse amplifier in a last stage to an input of a reverse amplifier in a first stage;

a feed back capacitance element provided across input and output ends of at least one of said reverse amplifiers.

wherein each reverse amplifier is connected to a first operating power source line and a second operating power source line, said first and second operating power source lines having respective levels; and an input end of at least one of said reverse amplifiers in a second stage or beyond, whose preceding reverse amplifier in immediately one stage ahead is not provided with said capacitance element, being connected to said first and second power source lines respectively through a first resistor and second resistor having an equal resistance value, said first and second resistors serving as a gain adjustor.

2. The operational amplifier as defined in claim 1 further including a phase compensating resistor, said phase compensating resistor being provided in series with said capacitance element.

3. The operational amplifier as defined in claim 2, wherein:

the number of the stages of said reverse amplifiers is three;

said first resistor and said second resistor being provided to an input end of a reverse amplifier in a second stage; and said capacitance element and said phase compensating resistor connected to each other are provided across input and output ends of a reverse amplifier in a third stage.

4. The operational amplifier as defined in claim 3, wherein each reverse amplifier is composed of a pair of field effect transistors each made of a complementary metal oxide semiconductor.

5. The operational amplifier as defined in claim 2, wherein each reverse amplifier is composed of a pair of field effect transistors each made of a complementary metal oxide semiconductor.

6. The operational amplifier as defined in claim 2, wherein a resistance of said phase compensating resistor is selected in such a manner to cancel a pole at a zero point, said pole being determined by a load capacitance.

7. The operational amplifier as defined in claim 1, wherein:

the number of the stages of said reverse amplifiers is three;

said first resistor and said second resistor being provided to an input end of a reverse amplifier in a second stage; and said capacitance element is provided across input and output ends of a reverse amplifier in a third stage.

8. The operational amplifier as defined in claim 7, wherein each reverse amplifier is composed of a pair of field effect transistors each made of a complementary metal oxide semiconductor.

9. The operational amplifier as defined in claim 1, wherein each reverse amplifier is composed of a pair of field effect transistors each made of a complementary metal oxide semiconductor.

* * * * *